United States Patent [19]

West et al.

[11] Patent Number: 4,535,053
[45] Date of Patent: Aug. 13, 1985

[54] MULTILAYER PHOTORESIST PROCESS UTILIZING CINNAMIC ACID DERIVATIVES AS ABSORBANT DYES

[75] Inventors: Paul R. West, Clifton Park; Bruce F. Griffing, Schenectady, both of N.Y.

[73] Assignee: General Electric Company, Schenectady, N.Y.

[21] Appl. No.: 619,526

[22] Filed: Jun. 11, 1984

[51] Int. Cl.$^3$ ............................ G03F 7/02; G03C 1/76
[52] U.S. Cl. ................................... 430/312; 430/286; 430/330; 430/374; 430/396; 430/502; 430/503; 430/512
[58] Field of Search ............... 430/312, 394, 396, 502, 430/503, 512, 513, 286, 287

[56] References Cited

U.S. PATENT DOCUMENTS 4,362,809  12/1982  Chen et al. .......................... 430/312
4,414,314  11/1983  Kaplan et al. ...................... 430/311

OTHER PUBLICATIONS

Bassous et al., "Acridine and Acridine Derivatives in Photoresist", IBM Tech. Dis. Bulletin, vol. 23(7B), Dec. 1980, p. 3387.
Chang et al., "An Ideal Projection Photolithography", 1981 Symposium on VLSI Technology, Digest of Technical Papers, Maui, Hi., U.S.A., Sep. 1981.
Submicrometer Contact Hole Delineation with a Two-Layer Deep-UV Portable Conformable Masking System, Petrillo et al., J. Vac. Sci. Technol., B, 1, (4), Oct.-Dec. 1983, pp. 1219-1224.
The Chemical Behavior of Positive Working Systems, Strieter, Eastman Kodak Co., Proc. of the Microelectronics Seminar Interface '76.
Practicing the Novolac Deep-UV Portable Conformable Masking Technique, Lin et al., J. Vac. Sci. Technol., 19(4), Nov./Dec. 1981, pp. 1313-1319.
Dec. 7, 1982, Official Gazette, p. 296.

*Primary Examiner*—John E. Kittle
*Assistant Examiner*—José G. Dees
*Attorney, Agent, or Firm*—William A. Teoli; James C. Davis, Jr.; James Magee, Jr.

[57] ABSTRACT

Spin castable polymethylmethacrylate photoresist compositions are provided utilizing certain cinnamic acid derivatives as dyes capable of absorbing light at about 436 nm and substantially transparent to light at about 220-250 nm. The spin castable polymethylmethacrylate resist compositions are used in making semiconductor devices by multilayer photoresist methods.

1 Claim, 1 Drawing Figure

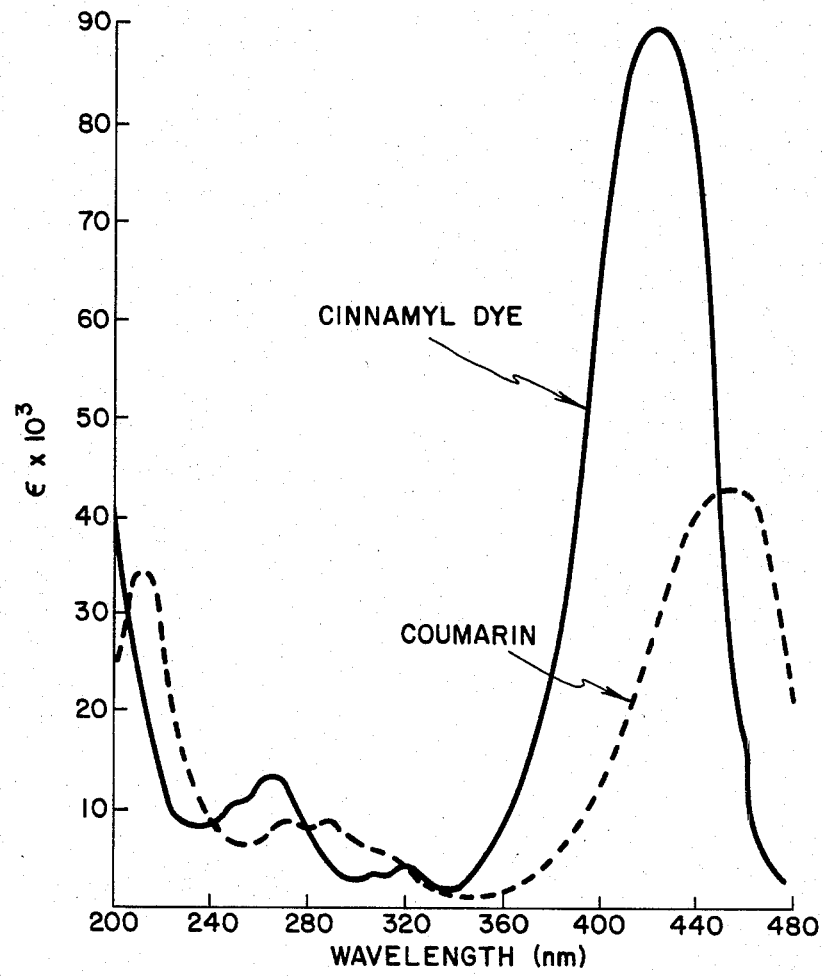

MULTILAYER PHOTORESIST PROCESS UTILIZING CINNAMIC ACID DERIVATIVES AS ABSORBANT DYES

BACKGROUND OF THE INVENTION

Prior to the present invention, as shown by Chen et al, U.S. Pat. No. 4,362,809, for Multilayer Photoresist Process Utilizing an Absorbant Dye, polymethylmethacrylate (PMMA) photoresist compositions containing coumarin as an absorbant dye, were used as a photoresist for etching semiconductor devices. Although the coumarin containing PMMA compositions of Chen et al were found useful in the practice of multilayer photoresist methods using an upper portable conformable mask (PCM), coumarin was found to interfere with the delineation of the lower PMMA resist layer during its subsequent UV exposure in the range of about 220-250 nm. As a result, an increase in the duration of ultraviolet light exposure time of the PMMA layer by a factor of at least two was found necessary to overcome the coumarin absorption in the region of 220-250 nm.

It would be desirable, therefore, to provide a PMMA photoresist composition having an absorbant dye which performed satisfactorily in a multilayer photoresist process using a portable conformable mask. In order to perform satisfactorily, the dye would have to be soluble in the PMMA and sufficiently non-volatile so that it could survive the initial spin and baking steps during the application of the PMMA on the substrate surface. The dye also would have to absorb at about 436 nm during the initial exposure of the upper positive resist layer to effect the formation of the PCM, which would substantially minimize unwanted reflections from the PMMA resist-substrate interface during such UV exposure. An additional criterion of the absorbant dye is that the dye would have to be substantially non-absorbing in the range of about 220-250 nm which would permit the delineation of the PMMA layer by a deep UV blanket through the PCM.

The present invention is based on the discovery that the certain derivatives of cinnamic acid having the formula

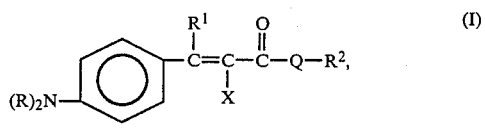

where R and $R^1$ are selected from hydrogen or $C_{(1-8)}$ alkyl, Q is $-O-$ or $-N-$, X is selected from halogen and nitrile, $R^2$ is a monovalent group selected from

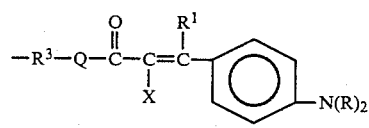

polyalkylene glycol, polyalkylene amide and polyalkylene ester and $R^3$ is a $C_{(1-8)}$ alkylene radical or $C_{(6-13)}$ aryl radical, have been found to be absorbant at about 400-465 nm, substantially transparent in the range of about 220-250 nm, soluble in an organic solvent solution of PMMA and in PMMA after spin casting and baking. There is shown in the figure, the extinction coefficients of the 1,3-propanediol diester of methyl(p-diethylamino-α-cyano)cinnamic acid and coumarin. These spectra were measured with a Perkin Elmer 330 UV Spectrophotometer in an ethanol solution.

The cinnamic acid derivatives of formula (I) which preferably can have a molecular weight in the range of about 350 to about 1000 are also substantially non-volatile at temperatures in the range of about 100° C. to 200° C. As a result, spin castable PMMA compositions are provided which are capable of absorbing in the 436 nm region while substantially transparent in the 220-250 nm region. As a result, these photoresists can be advantageously utilized in multilayer photoresists processes without the disadvantages of the prior art requiring excessive exposure time due to a high level of absorbance in the 220-250 nm region.

STATEMENT OF THE INVENTION

There is provided by the present invention a spin castable photoresist composition comprising
(A) 100 parts of an inert organic solvent
(B) 1 to 15 parts of a polymethylmethacrylate and
(C) 0.01 to 1.0 parts of the cinnamic acid derivative of formula (I).

There is also provided by the present invention a process for photopatterning a polymethylmethacrylate resist on a silicon substrate which comprises
(1) spin casting onto a silicon substrate, a polymethylmethacrylate resin composition comprising
   (A) 100 parts of an inert organic solvent
   (B) 1 to 15 parts of a polymethylmethacrylate and
   (C) 0.01 to 1.0 parts of the cinnamic acid derivative of formula (I),
(2) baking the applied resist composition of (1) to a temperature of 140° to 200° C. to produce a polymethylmethacrylate resist layer having a thickness of from 1 to 3 microns,
(3) applying onto the layer of (2) a polynovolak resist to a thickness of from about 0.2 to 1.0 microns,
(4) baking the resist layer of (3) to a temperature of about 70° to 110° C.,
(5) exposing the upper resist layer of (4) to patterned UV light at about 350 to 440 nm to produce a latent positive image in the resist,
(6) developing the resist of (5) and thereafter baking the resulting portable conformable mask,
(7) exposing the composite of the resulting portable conformable mask and the polymethylmethacrylate resist layer to UV light in the range of 190 to 250 nm to produce a positive image of the portable conformable mask, and
(8) developing the resulting polymethylmethacrylate resist.

There are included by the cinnamic acid derivatives of formula (I) compounds such as

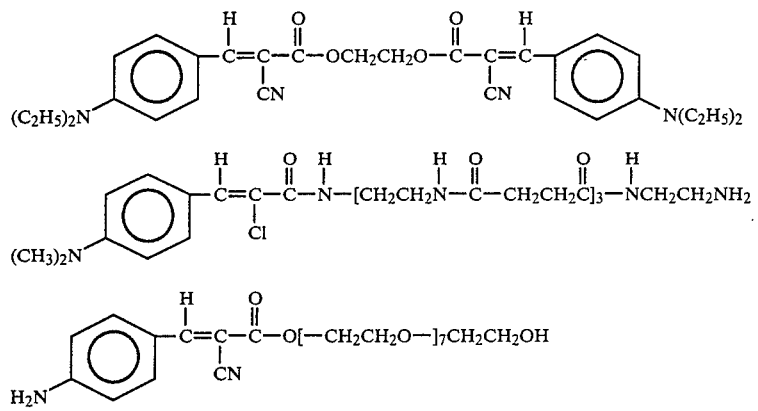

Polymethylmethacrylate resists which can be utilized in the practice of the present invention are, for example, Elvacite ® 2041 and 2010, of the Dupont de Nemours Company, Wilmington, Del.; KT1 Standard PMMA resists, etc.

The lower average molecular weight of PMMA 2010 permits a 2 micron film thickness in a single spin coating application. Additional characteristics of PMMA 2010 and PMMA 2041 are shown in the following table:

|  | PMMA 2010 | PMMA 2041 |
| --- | --- | --- |
| Avg. molecular weight | 150,000 | 500,000 |
| Max. Thickness per spinning | 2 μm | 1 μm |
| Range of $r/r_o$ in MIBK | 20-120 | 20-200 |
| in chlorobenzene | 20-80 | 30-120 |
| in toluene | 20-120 | 20-200 |
| $r_o$ in MIBK (nm/min) | 56 | 14 |
| $r_o$ in chlorobenzene | 381 | 63 |
| $r_o$ in toluene | 73 | 29 |

Among the positive photoresist compositions which can be used in the production of the PCM (portable conformable mask), there are included novolak resins modified with naphthoquinonediazides as shown in the chemical behavior of positive working systems by Jeffrey C. Streeter, Eastman Kodak Company, Proceedings of the Microelectronic Seminar Interface '76, pp. 116-121. A typical reaction for preparing these positive photoresists is to react the hydroxyl groups on a phenolformaldehyde resin with naphthoquinonediazide sulfonyl chloride. The most common solvents used in the novolak positive resists are 2-ethoxyethylacetate and 2-methoxyethylacetate. In some cases, xylene and butylacetate can be incorporated into the solvent system to give various drying and coating characteristics.

In the practice of the invention, a the PMMA photoresist composition can be made by blending together commercially available PMMA which can have a molecular weight in the range of from about 100,000 to 900,000 with an organic solvent such as chlorobenzene, toluene, etc., and the cinnamic acid derivative as shown in formula (I). The resulting PMMA compositions are spin castable.

In the practice of the method of the present invention, the PMMA composition containing the cinnamic acid derivative can be spun onto a silicon wafer to a thickness of about 1.7 microns. Depending upon the molecular weight of the PMMA, the spinning of the PMMA composition can be accomplished in several steps or in a single spin coating application. If desired, the applied PMMA coating can be baked during multiple applications or it can be baked to a temperature in the range of about 140° to 200° C. for 30 minutes if in a final bake.

The top positive novolak resist layer is then spun onto the PMMA surface. After a thickness of 0.5 microns is achieved with the top novolak resist it is baked at a temperature in the range of 70° to 90° C. for a period of 1 to 30 minutes. The novolak resist is then exposed to ultraviolet employing a Mercury Arc lamp having an intensity of 100 mW/cm$^2$ and a wave length of from 360 to 440 nm for a period of from 0.3 to 1 seconds.

Experience has shown that a soak in a NaOH solution can provide for advantageous results in the applied novolak resist prior to exposure. The NaOH should have a molar concentration in the range of 0.2 to 0.5 for optimum results. If desired, the developed PCM can then be oxygen plasma cleaned in accordance with the procedure of Petrillo et. al, Submicrometer Contact Hole Delineation with a Two-Layer Deep-UV Portable Conformable Masking System, J. Vac. Sci. Technol. B 1(4), Oct.-Dec. 1983. The positive resist PMMA composite can be exposed to UV irradiation having a wave length of from 190 to 250 nm. The resulting exposed PMMA composite can then be developed utilizing a standard acetone/isopropanol solution to produce a submicrometer contact hole to produce a multilayer photoresist having a patterned PMMA photoresist layer on a silicon wafer useful for making a semiconductor device.

In order that those skilled in the art will be better able to practice the invention, the following example is given by way of illustration and not by way of limitation. All parts are by weight.

EXAMPLE

A mixture of p-diethylaminobenzaldehyde (24.2 g, 0.136 mole) methyl cyanoacetate (13.5 g, 0.136 mole), ε-aminocaproic acid (0.33 g) and glacial acetic acid (3 ml) in 40 ml of toluene was refluxed in a flask equipped with a Dean-Stark trap and a condensor. After about 2 hours the theoretical quantity of water (2.4 ml) was collected. The hot solution was treated with activated charcoal and filtered through Celite. The toluene was removed under reduced pressure and replaced with 95% ethanol. On cooling 30.4 g (0.118 mole, 86.5% yield) of methyl(p-diethylamino-α-cyano)-cinnamate orange needles were deposited and collected: mp 87°-89° C.

A 250 ml flask was charged with 19.1 g (0.074 mole) of the methyl (p-diethylamino-α-cyano)cinnamate, 2.84 g (0.0373 mole) of distilled 1,3-propanediol, 0.1 g of sodium hydride and 60 ml of dimethyl sulfoxide (distilled from calcium hydride). The mixture was stirred and heated at 100°-110° C. at a pressure of about 30 torr for 5 hours. The temperature was then raised to distill off the dimethyl sulfoxide. The remaining dark red material was crystallized from 95% ethanol, affording 14.1 g of the crude dimer, mp 110° C. Further recrystallization gave 10.6 g (0.02 mole, 54% yield) of crystalline 1,3-propanediol diester of p-diethyl-amino-α-cyano cinnamic acid having a melting point of 136°-138° C.

There was added to 33 g of a 6% by weight solution of Elvacite 2041 in chlorobenzene, 0.1 g of the cinnamyl ester. The mixture was stirred for one half hour, then filtered through a 0.2μ Teflon ® resin membrane filter.

The chlorobenzene solution of PMMA and the cinnamyl ester was poured onto silicon wafers and spun at 4000 rpm for 24 seconds. The resulting film was washed in a convection oven at 190° C. for 30 min. Another film was likewise coated onto the first layer and again baked for 30 min. A third layer was then coated and baked to give a total thickness of about 1.7μ. The dyed PMMA film was then coated with Shipley AZ-1450B to a thickness of 0.5μ using a Macronetics photoresist coater equipped with a track oven set at 87° C. The top photoresist layer was printed using an Optimetrix stepper. The top layer resist was then spray developed with Shipley AZ-351 developer diluted 1 part with 3 parts water. Exposure of the PMMA layer was accomplished by flood illumination using a Fusion Systems Microlite 100C equipped with a mercury bulb. An exposure of 95 seconds at 40 mW/cm² was used. The wafer was subsequently spray developed using diglyme for 24 seconds, followed by an isopropanol rinse. Based on this procedure, there was obtained a patterned photoresist having isolated 0.8μ lines and spaces over 0.5μ SiO₂ steps.

Although the above example is directed to only a few of the very many variables which can be utilized in the practice of the present invention, it should be understood that the present invention is directed to a much broader variety of cinnamic acid derivatives as shown by formula (I) in combination with various polymethylmethacrylates and novolak resins to produce a multilayer photoresist as shown in the description preceding this example.

What we claim as new and desire to secure by Letters Patent of the United States is:

1. A process for photopatterning a polymethylmethacrylate resist on a silicon substrate which comprises
   (1) spin casting onto a silicon substrate, a polymethylmethacrylate resin composition comprising
      (A) 100 parts of an inert organic solvent
      (B) 1 to 15 parts of a polymethylmethacrylate and
      (C) 0.01 to 1.0 parts of a cinnamic acid derivative included within the formula

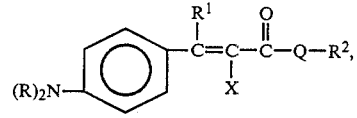

(2) baking the applied resist composition of (1) to a temperature of 100° to 200° C. to produce a polymethylmethacrylate resist layer having a thickness of from 1 to 3 microns,
   (3) applying onto the layer of (2) a polynovolak resist to a thickness of from about 0.2 to 1.0 microns,
   (4) baking the resist layer of (3) to a temperature of 140° to 200° C.,
   (5) exposing the upper resist layer of (4) to patterned UV light at about 350 to 440 nm to produce a latent positive image in the resist,
   (6) developing the resist of (7) and thereafter baking the resulting portable conformable mask,
   (7) exposing the composite of the portable conformable mask and the polymethylmethacrylate resist layer to UV light in the range of 190 to 250 nm to produce a positive image of the portable conformable mask, and
   (8) developing the resulting polymethylmethacrylate resist, where R and $R^1$ are selected from hydrogen or $C_{(1-8)}$ alkyl, Q is —O— or —N—, X is selected from nitrile and halogen, $R^2$ is a monovalent group selected from

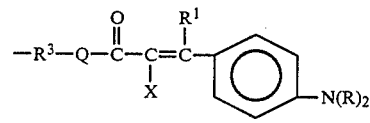

polyalkylene glycol, polyalkylene amine and polyalkylene ester and $R^3$ is a $C_{(1-8)}$ alkylene radical or $C_{(6-13)}$ aryl radial.

* * * * *